US00RE36613E

United States Patent [19]

Ball

[11] E Patent Number: Re. 36,613

[45] Reissued Date of Patent: Mar. 14, 2000

[54] MULTI-CHIP STACKED DEVICES

[75] Inventor: Michael B. Ball, Boise, Id.

[73] Assignee: Micron Technology, Inc., Boise, Id.

[21] Appl. No.: 08/610,127

[22] Filed: Feb. 29, 1996

Related U.S. Patent Documents

Reissue of:

[64] Patent No.: 5,291,061
Issued: Mar. 1, 1994
Appl. No.: 08/043,503
Filed: Apr. 6, 1993

[51] Int. Cl.[7] ..... H01L 23/48; H01L 23/52; H01L 29/40; H01L 23/02

[52] U.S. Cl. ..... 257/777; 257/686; 257/783; 257/784; 257/676

[58] Field of Search ..... 257/686, 777, 257/784, 676, 783

[56] References Cited

U.S. PATENT DOCUMENTS

| | | | |
|---|---|---|---|
| 4,567,643 | 2/1986 | Drigyet et al. | 29/832 |
| 4,984,059 | 1/1991 | Kubota et al. | 257/676 |
| 4,996,587 | 2/1991 | Hinrichsmeyer et al. | 257/676 |
| 5,012,323 | 4/1991 | Farnworth | 257/723 |
| 5,049,976 | 9/1991 | Demmin et al. | 257/782 |

FOREIGN PATENT DOCUMENTS

| | | | |
|---|---|---|---|
| 56-62351 | 5/1981 | Japan . | |
| 60-182731 | 9/1985 | Japan | 257/777 |
| 62-126661 | 6/1987 | Japan | 257/686 |
| 63-128736 | 6/1988 | Japan | 257/686 |
| 1-28856 | 1/1989 | Japan | 257/686 |
| 3-169062 | 7/1991 | Japan | 257/686 |
| 4-56262 | 2/1992 | Japan | 257/686 |

*Primary Examiner*—Teresa M. Arroyo
*Attorney, Agent, or Firm*—Trask, Britt & Rossa

[57] ABSTRACT

A multiple stacked die device is disclosed that contains up to four dies and does not exceed the height of current single die packages. Close-tolerance stacking is made possible by a low-loop-profile wire-bonding operation and thin-adhesive layer between the stacked dies.

26 Claims, 2 Drawing Sheets

MULTI-CHIP STACKED DEVICES

Matter enclosed in heavy brackets [ ] appears in the original patent but forms no part of this reissue specification; matter printed in italics indicates the additions made by reissue.

FIELD OF THE INVENTION

This invention relates to a multiple die module that has a thickness the same or less than a standard package but has two or more stacked die, thereby increasing device density.

BACKGROUND OF THE INVENTION

Semiconductor devices are typically constructed en masse on a silicon or gallium arsenide wafer through a process which comprises a number of deposition, masking, diffusion, etching, and implanting steps. When the devices are sawed into individual rectangular units, each takes the from of an integrated circuit (IC) die. In order to interface a die with other circuitry, it is (using contemporary conventional packaging technology) mounted on a lead frame paddle of a lead-frame strip which consists of a series of interconnected lead frames, typically ten in a row. The die-mounting paddle of a standard lead frame is larger than the die itself, and it is surrounded by multiple lead fingers of individual leads. The bonding pads of the die are then connected one by one in a wire-bonding operation to the lead frame's lead finger pads with extremely fine gold or aluminum wire. Following the application of a protective layer to the face of the die, it, and a portion of the lead frame to which it is attached, is encapsulated in a plastic material, as are all other die/lead-frame assemblies on the lead-frame strip. A trim-and-form operation then separates the resultant interconnected packages and bends the leads of each package into the proper configuration.

In the interest of higher performance equipment and lower cost, increased miniaturization of components and greater packaging density have long been the goals of the computer industry. IC package density is primarily limited by the area available for die mounting and the height of the package. Typical computer-chip heights in the art are about 0.110 inches. A method of increasing density is to stack die or chips vertically.

U.S. Pat. No. 5,01,323, issued Apr. 30, 1991, having a common assignee with the present application, discloses a pair of rectangular integrated-circuit dice mounted on opposite sides of the lead frame. An upper, smaller die is back-bonded to the upper surface of the lead fingers of the lead frame via a first adhesively coated, insulated film layer. The lower, slightly larger die is face-bonded to the lower surface of the lead extensions with the lower lead-frame die-bonding region via a second, adhesively coated, film layer. The wire-bonding pads on both upper die and lower die are interconnected with the ends of their associated lead extensions with gold or aluminum wires. The lower die needs to be slightly larger in order that the die pads are accessible from above so that gold wire connections can be made to the lead extensions (fingers).

U.S. Pat. No. 4,996,587 (referred to hereafter as '587) shows a semiconductor chip package which uses a chip carrier to support the chips within a cavity. The chip carrier a shown in the fingers has as a slot that permits connection by wires to bonding pads which, in turn, connect to the card connector by conductors. An encapsulation material is placed only on the top surface of the chip in order to provide heat dissipation from the bottoms when carriers are stacked.

A Japanese Patent No. 56-62351(A) issued to Sano in 1981 discloses three methods of mounting two chips on a lead frame and attaching the pair of semiconductor chips (pellets) to a common lead frame consisting of:

method 1 two chips ted on two paddles;

method 2 one chip mounted over a paddle and one below not attached to the paddle; and method 3 one chip attached above and one chip attached below a common paddle.

The chips are apparently wired in parallel as stated in the "PURPOSE" of Sano.

The chip of patent '587 are also apparently wired in parallel by contacts on the "S" chips which contact the connection means.

It is the purpose of this invention to provide multiple stacked dies assembled in a special vertical configuration such that as many as four encapsulated dies will have a height no greater than existing 0.110-inch high dies and also have a separate lead and lead finger for each die pad connection.

SUMMARY OF THE INVENTION

The invention generally stated is a multiple-die low-profile semiconductor device comprising:

a lead-frame paddle supported by a lead frame;

a controlled, first, thin-adhesive layer affixing a first die above the paddle;

a plurality of thin wires having a first low-loop wire bond to a plurality of first die-bonding pads and a second wire bond to a plurality of adjacent lead-frame frame lead fingers;

a second thin-adhesive layer affixing a second die above the first die;

a second plurality of thin wires having low-loop wire bonds to a plurality of second die-bonding pads and second wire bonds to the plurality of lead fingers;

additional dies affixed above the second die, by additional subsequent layers of adhesive and having additional thin wires bonded to addition bonding pads and lead fingers; and an encapsulated layer surrounding all dies, adhesive layers and thin wires.

Other object, advantages, and capabilities of the present invention will become more apparent as the description proceeds.

BRIEF DESCRIPTION OF THE DRAWINGS

The invention may be better understood and further advantages and uses thereof may become more readily apparent when considered in view of the following detailed description of exemplary embodiments, taken with the accompanied drawings, in which.

DETAILED DESCRIPTION OF THE PREFERRED EMBODIMENT

Figure 1:
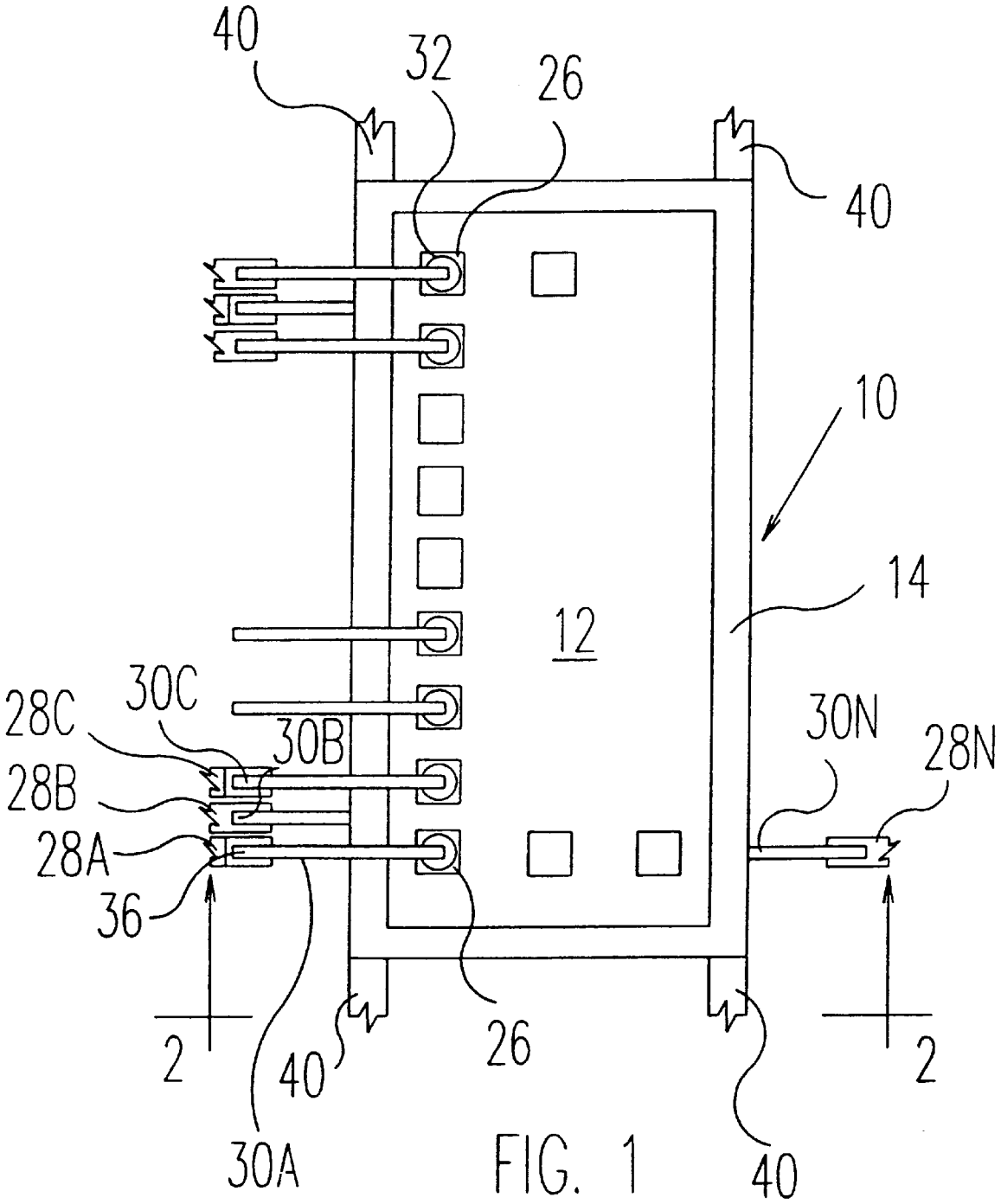
FIG. 1 is a partial plan view of the stacked die, lead fingers, and bonded wires of the present invention.

Referring to FIG. 1, the stacked die device 10 is shown prior to encapsulation disclosing the top die 12 mounted the paddle 14 and other dies 16, 18, and 20 (FIG. 2) which are adhesively connected to each other by a controlled-thickness thermoplastic-adhesive layer at 22. Thermoplastic indicating the adhesive sets at an elevated temperature. The group of four dies are attached to the paddle 14 by a controlled thin-adhesive layer 24.

Each of the die bonding pads 26 in double rows are electrically connected to multiple lead fingers 28A, 28B, 28C . . . 28N by thin (0.001 inch) gold or aluminum wires 30A, 30B, 30C . . . 30N; gold being the preferred metal. For clarity, only part of the 18 bonding pads, wires, and fingers are shown. The critical bonding method used at the die end pad 26 is ultrasonic ball bond as named by the shape of the bond as at 32. This first-installed bond and formed gold wire are low-loop wire bonds as seen at critical dimension 34, as will be described later.

The other end of gold wires 30 are attached to the lead fingers by a wedge bond 36, which is also an ultrasonic indicating the use of ultrasonic energy to heat the wire 30 as it is compressed against the lead finger 28. The wedge bond is not used on the die because the bonding machine contacts the bonding surface and could damage this critical surface. The lead fingers may be formed upward as at 38 to permit the use of shorter wires 30.

Paddle 14 which supports the stack is attached to the lead frame typically at four corners as at 40 and also typically, in this application, would have a downset from the lead frame and lead fingers 28 as at dimension 42. The stack is finally encapsulated by a plastic or ceramic at 44.

Figure 2:
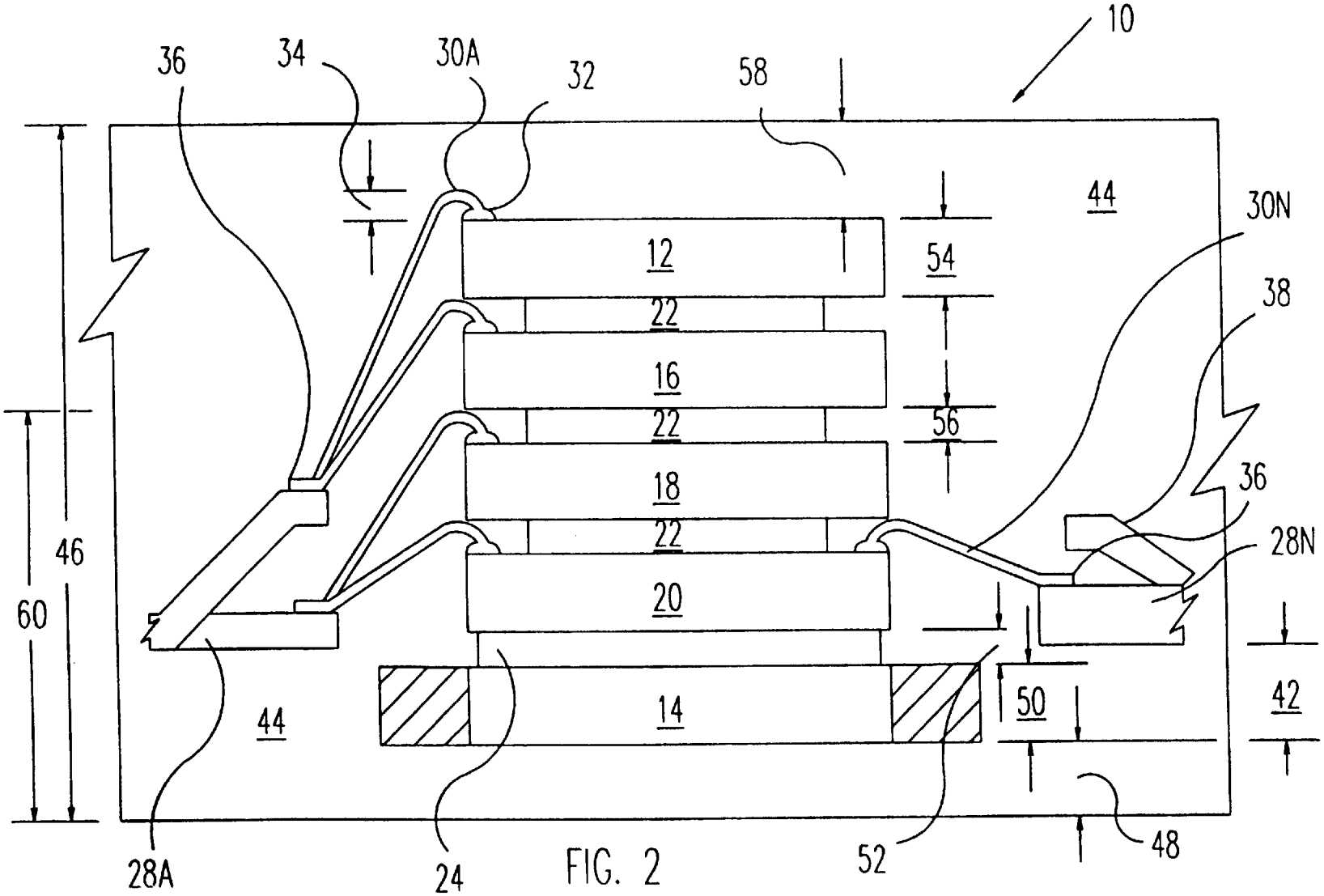
FIG. 2 is a side elevation taken through 2—2 of FIG. 1 showing a four die stacking.

A dimensional analysis is provided by referring to FIG. 2.

By careful control of layer thicknesses, it is possible to fabricate a four-stack die device having as overall height 46 of about 0.110 inches which is the same height as a current single die. Starting at the bottom, the encapsulation thickness 48 is between 0.010 and 0.012 inches. The paddle 74 thickness 50 can be between 0.005 and 0.010 inches and is a matter of choice. The controlled adhesive-layer thickness 52 can be from 0.001 to 0.005 inches. The individual dies 20, 18, 16, and 12 each have a thickness 54 of 0.012 inches nd the critical controlled, adhesive-layer thicknesses 56 between each die are between 0.008 and 0.010 inches. These thin layers have to be slightly greater than the low-loop wire dimension 34, which is about 0.006 inches. Finally, the top encapsulation 58 is between 0.010 and 0.012 inches so as to cover the top loop.

Thus it can be seen by carefully controlling and minimizing the adhesive layer thicknesses 56, the top and bottom encapsulation thicknesses 48 nd 58, and the paddle adhesive layer 52 that it is possible to have an overall height between 0.108 and 0.110 inches overall for the four-stack die.

If the looser tolerances were used for a two-stack die, the height at 60 would be between 0.058 and 0.073 inches and for a three-die stack it would be from 0.078 to 0.100 inches.

The fabrication of these two or four-stack die devices, necessarily, has to be from the bottom up, since it is not possible to form the die pad wire ball bond 32 on the lower dies 16, 18, and 30, if the four dies are already stacked. This is due to the overhead space required by the wire bond machine.

The die pads 26 of each die can be each connected to an individual lead finger 28 or the dies can be wired in parallel. The former configuration would, therefore, require (for a four die stack) something less than 4×18=72 leads, while parallel connections would require something on the order of 22 or more pins, depending on the type of devices and system requirements. The final packages can be in the form of a small outline J-leaded (SOJ) package, a dual in-line package (DIP), a single in-line package (SIP), a plastic leaded chip carrier (PLCC), and a zig-zag in-line package (ZIP).

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A multiple-die low-profile semiconductor device comprising:

a. a lead-frame paddle supported by a lead frame;

b. a controlled, first, thin-adhesive layer of about 0.001 inches affixing a first die above the paddle;

c. a plurality of thin wires having a first low-loop wire bond to a plurality of first [diebonding] *die-bonding* pads, said wire bond having a wire height above the bonding pad of about 0.006 inches, and a second wire bond to a plurality of adjacent lead-frame lead fingers;

d. a second thin-adhesive layer of about 0.008 inches affixing a second die above the first die;

e. a second plurality of thin wires having low-loop wire bonds to a plurality of second die-bonding pads and second wire bonds to the plurality of lead fingers;

f. two additional dies affixed above the second die by additional subsequent layers of adhesive of about 0.008 inches and having additional thin wires bonded to additional bonding pads and lead fingers; and g. an [encapsulated] *encapsulation* layer surrounding all dies, adhesive layers, and thin wires wherein a total encapsulated package height is about 0.110 inches.

2. A multiple-die low-profile semiconductor device comprising:

a. a lead-frame paddle supported by a lead frame;

b. a controlled, first, thin-adhesive layer of about 0.001 to 0.005 inches affixing a first die above the paddle;

c. a plurality of thin wires having a first low-loop wire bond to a plurality of first die-bonding pads, said low-loop wire [ball] bond having a wire height above the *first die*-bonding pads of about 0.006 inches and a second wire bond to a plurality of adjacent lead-frame lead fingers;

d. a second thin-adhesive layer of about 0.008 to 0.010 inches affixing a second die above the first die;

e. a second plurality of thin wires having low-loop wire bonds to a plurality of second die-bonding pads and second wire bonds to the plurality of lead fingers;

f. an [encapsulated] *encapsulation* layer surrounding all die adhesive layers and thin wires wherein a total encapsulation-layer height is about 0.070 inches.

*3. A multiple-die low-profile semiconductor device comprising:*

*a. a lead-frame paddle supported by a lead frame;*

*b. a controlled, first, thin-adhesive layer affixing a first die above the paddle;*

*c. a plurality of thin wires having a first low-loop wire bond to a plurality of first die-bonding pads and a second wire bond to a plurality of adjacent lead-frame lead fingers;*

*d. a second thin-adhesive layer affixing a second die above the first die;*

*e. a second plurality of thin wires having low-loop wire bonds to a plurality of second die-bonding pads and second wire bonds to the plurality of lead fingers;*

*f. two additional dies affixed above the second die by additional subsequent layers of adhesive and having additional thin wires bonded to additional bonding pads and lead fingers; and* g. an encapsulation layer surrounding all dies, adhesive layers, and thin wires and having a height of about 0.110 inches.

4. The semiconductor device as recited in claim 3 wherein the paddle is downset from the lead fingers and selected lead fingers are formed up thereby providing for additional space within the device and shorter thin wires, respectively.

5. The semiconductor device as recited in claim 4 wherein the thin wire is gold, and the first low-loop bond is a ball bond and the second bond is a wedge bond.

6. The semiconductor device as recited in claim 3 wherein a low-loop bond wire height above the bonding pad is about 0.006 inches and the second and subsequent thin-adhesive layers are about 0.008 inches.

7. The semiconductor device as recited in claim 6 wherein the first thin-adhesive layer is about 0.001 inches.

8. A multiple-die, low-profile semiconductor device comprising:

a. a lead-frame paddle supported by a lead frame;

b. a controlled, first, thin-adhesive layer affixing a first die above the paddle;

c. a plurality of thin wires having a first low-loop wire bond to a plurality of first die-bonding pads, said low-loop wire bond having a wire height above the bonding pads of about 0.006 inches and a second wire bond to a plurality of adjacent lead-frame lead fingers;

d. a second thin-adhesive layer of about 0.008 to 0.010 inches affixing a second die above the first die;

e. a second plurality of thin wires having low-loop wire bonds to a plurality of second die-bonding pads and second wire bonds to the plurality of lead fingers; and f. an encapsulation layer surrounding all die adhesive layers and thin wires.

9. The semiconductor device as recited in claim 8 wherein the first thin-adhesive layer is about 0.001 to 0.005 inches.

10. The semiconductor device as recited in claim 9 wherein a total encapsulation layer height is about 0.070 inches.

11. A multiple-die, low-profile semiconductor device comprising:

a lead-frame paddle supported by a lead frame;

a first adhesive layer affixing a first die above the paddle;

a plurality of wires having first wire bonds to a respective plurality of first die-bonding pads and second wire bonds to a respective plurality of adjacent lead-frame lead fingers;

a second adhesive layer affixing a second die above the first die;

a second plurality of wires having first wire bonds to a respective plurality of second die-bonding pads and second wire bonds to a respective plurality of lead fingers;

two additional dies affixed above the second die by additional subsequent layers of adhesive and having additional wires bonded to additional respective bonding pads and lead fingers; and an encapsulation layer surrounding all dies, adhesive layers, and wires and having a height of about 0.110 inches.

12. The semiconductor device as recited in claim 11, wherein the paddle is downset from the lead fingers and selected lead fingers are formed up thereby providing for additional space within the device and shorter wires, respectively.

13. The semiconductor device as recited in claim 12, wherein the wire is gold, and the first bond is a ball bond and the second bond is a wedge bonds.

14. The semiconductor device as recited in claim 11, wherein a bond wire height above the first and second die-bonding pads for all but the uppermost die is about 0.006 inches and the second and subsequent adhesive layers are about 0.008 inches.

15. The semiconductor device as recited in claim 14 wherein the first thin-adhesive layer is about 0.001 inches.

16. A multiple-die, low-profile semiconductor device comprising:

a lead-frame paddle supported by a lead frame;

a first adhesive layer affixing a first die above the paddle;

a plurality of respective wires having first low-loop wire bonds to a plurality of first die-bonding pads, said low-loop wire bonds having a wire height above the bonding pads of about 0.006 inches, and second wire bonds to a plurality of adjacent lead-frame lead fingers;

a second adhesive layer of about 0.008 to 0.010 inches affixing a second die above the first die;

a second plurality of respective wires having first wire bonds to a plurality of second die-bonding pads and second wire bonds to a respective plurality of lead fingers; and an encapsulation layer surrounding all die adhesive layers and wires.

17. The semiconductor device as recited in claim 16 wherein the first adhesive layer is about 0.001 to 0.005 inches.

18. The semiconductor device as recited in claim 17 wherein a total encapsulation layer height is about 0.070 inches.

19. A multiple-die, low-profile semiconductor device comprising:

a lead-frame paddle supported by a lead frame;

a first die affixed above the paddle;

an adhesive layer having a thickness and affixing a second die above the first die; and a plurality of wires having first wire bonds to a respective plurality of first die-bonding pads and second wire bonds to a respective plurality of lead-frame lead fingers, the first wire bonds having loop heights above the first die of less than the thickness of the adhesive layer.

20. The semiconductor device of claim 19, further including a second plurality of wires having first wire bonds to a respective plurality of second die-bonding pads and second wire bonds to a respective plurality of lead fingers.

21. The semiconductor device of claim 20, further including two additional dies affixed above the second die by additional subsequent layers of adhesive and having additional wires bonded to additional respective bonding pads and lead fingers, the wires bonded to at least those affixed die below the uppermost die having loop heights above the die to which those wires are bonded of less than the thickness of the adhesive layer affixing the die above.

22. The semiconductor device of claim 19, further including an encapsulation layer surrounding all dies, adhesive layers, and wires.

23. A multiple-die, low-profile semiconductor device comprising:

a lead-frame paddle supported by a lead frame;

a first die having bonding pads at the periphery thereof and affixed above the paddle;

an adhesive layer having a thickness and affixing a second die above the first die, said adhesive layer leaving the first die peripheral bonding pads uncovered; and

*a plurality of wires having first wire bonds to a respective plurality of first die-bonding pads and second wire bonds to a respective plurality of lead-frame lead fingers, the first wire bonds having loop heights above said first die of less than the thickness of said adhesive layer.*

*24. The semiconductor device of claim 23, further including a second plurality of wires having first wire bonds to a respective plurality of second die-bonding pads and second wire bonds to a respective plurality of lead fingers.*

*25. The semiconductor device of claim 24, further including two additional dies affixed above the second die by additional subsequent layers of adhesive and having additional wires bonded to additional respective bonding pads and lead fingers, at least the dies below the uppermost having peripheral bond pads, the adhesive layers leaving the peripheral bond pads uncovered, and the wires bonded to at least those affixed dies except the uppermost die having loop heights above the die to which the wires are bonded of less than the thickness of the adhesive layer affixing the die above.*

*26. The semiconductor device of claim 23, further including an encapsulation layer surrounding all dies, adhesive layers, and wires.*

* * * * *